US008709870B2

(12) United States Patent
Huening (10) Patent No.: US 8,709,870 B2
(45) Date of Patent: Apr. 29, 2014

(54) METHOD OF FORMING SOLDERABLE SIDE-SURFACE TERMINALS OF QUAD NO-LEAD FRAME (QFN) INTEGRATED CIRCUIT PACKAGES (75) Inventor: Kenneth J. Huening, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 814 days.

(21) Appl. No.: 12/688,158

(22) Filed: Jan. 15, 2010

(65) Prior Publication Data

US 2011/0033977 A1  Feb. 10, 2011

Related U.S. Application Data (60) Provisional application No. 61/231,945, filed on Aug. 6, 2009.

(51) Int. Cl.
H01L 21/00 (2006.01)

(52) U.S. Cl.
USPC ........... 438/109; 257/772; 257/779; 257/726; 257/727; 257/730; 438/15; 438/106; 438/612

(58) Field of Classification Search
USPC ............ 438/15, 106, 612, 109; 257/772, 779, 257/726, 727, 730
See application file for complete search history.

(56) References Cited

U.S. PATENT DOCUMENTS

| 2,756,485 | A | * | 7/1956 | Abramson et al. | 29/830 |
|---|---|---|---|---|---|
| 2,929,750 | A | * | 3/1960 | Strull et al. | 257/47 |
| 3,020,175 | A | * | 2/1962 | Furguson et al. | 427/96.2 |
| 4,139,726 | A | * | 2/1979 | Penrod et al. | 174/531 |
| 4,708,281 | A | * | 11/1987 | Nelson et al. | 228/180.1 |
| 4,795,694 | A | * | 1/1989 | Groeber et al. | 430/314 |
| 4,932,585 | A | * | 6/1990 | Nakamura | 228/208 |
| 5,240,169 | A | * | 8/1993 | Gileta | 228/180.1 |
| 5,240,588 | A | * | 8/1993 | Uchida | 205/125 |
| 5,855,323 | A | * | 1/1999 | Yost et al. | 239/135 |
| 6,116,497 | A | * | 9/2000 | Scheel et al. | 228/234.2 |
| 6,143,981 | A | * | 11/2000 | Glenn | 174/534 |
| 6,271,060 | B1 | * | 8/2001 | Zandman et al. | 438/113 |
| 6,395,129 | B1 | * | 5/2002 | Vu et al. | 156/345.11 |
| 6,409,878 | B1 | * | 6/2002 | Li et al. | 156/345.23 |
| 6,583,500 | B1 | * | 6/2003 | Abbott et al. | 257/666 |
| 6,656,770 | B2 | * | 12/2003 | Atwood et al. | 438/118 |
| 6,777,800 | B2 | * | 8/2004 | Madrid et al. | 257/690 |
| 7,205,180 | B1 | * | 4/2007 | Sirinorakul et al. | 438/123 |
| 7,268,438 | B2 | * | 9/2007 | Nishiyama et al. | 257/780 |
| 7,851,897 | B1 | * | 12/2010 | Cate et al. | 257/678 |
| 8,076,181 | B1 | * | 12/2011 | Pruitt et al. | 438/111 |
| 8,174,116 | B2 | * | 5/2012 | Masuda et al. | 257/724 |

(Continued)

Primary Examiner — Fernando L Toledo
Assistant Examiner — Mohammed Shamsuzzaman
(74) Attorney, Agent, or Firm — Advent, LLP (57) ABSTRACT A method of forming an integrated circuit (IC) package is disclosed comprising: (a) removing oxides from side surfaces of terminals of the IC package; (b) substantially covering an underside of the terminals of the IC package; and (c) forming a solder coating on the side surfaces of terminals of the IC packages while covering the underside of the terminals of the IC package. The solder coating on the side surfaces of the terminals protects the terminals from oxidation due to aging and subsequent processes. Additionally, the solder coating on the side surfaces of the terminals substantially improves the solderability of the IC package to printed circuit boards (PCBs) or other mountings. This further facilitates the inspection of the solder attachment using less expensive and complicated methods.

18 Claims, 5 Drawing Sheets

(56) References Cited

U.S. PATENT DOCUMENTS

| | | | |
|---|---|---|---|
| 2001/0026957 A1* | 10/2001 | Atwood et al. | 438/122 |
| 2002/0017706 A1* | 2/2002 | Sone | 257/676 |
| 2003/0150109 A1* | 8/2003 | Magoi | 29/846 |
| 2003/0178313 A1* | 9/2003 | Tanaka et al. | 205/74 |
| 2004/0187303 A1* | 9/2004 | LaPlante et al. | 29/825 |
| 2004/0238923 A1* | 12/2004 | Lee et al. | 257/670 |
| 2005/0003586 A1* | 1/2005 | Shimanuki et al. | 438/124 |
| 2005/0178657 A1* | 8/2005 | Kirby et al. | 204/194 |
| 2006/0065978 A1* | 3/2006 | Nishiyama et al. | 257/737 |
| 2006/0145352 A1* | 7/2006 | Soga et al. | 257/772 |
| 2006/0223205 A1* | 10/2006 | Jacobs et al. | 438/22 |
| 2006/0286369 A1* | 12/2006 | Tanaka et al. | 428/332 |
| 2008/0029879 A1* | 2/2008 | Tuckerman et al. | 257/704 |
| 2008/0258273 A1* | 10/2008 | Liang et al. | 257/666 |
| 2010/0081237 A1* | 4/2010 | Wong et al. | 438/127 |
| 2010/0320596 A1* | 12/2010 | Eom et al. | 257/737 |
| 2011/0006322 A1* | 1/2011 | Li et al. | 257/98 |
| 2011/0034022 A1* | 2/2011 | Nakamura | 438/613 |
| 2012/0048355 A1* | 3/2012 | Hsieh et al. | 136/252 |

* cited by examiner

METHOD OF FORMING SOLDERABLE SIDE-SURFACE TERMINALS OF QUAD NO-LEAD FRAME (QFN) INTEGRATED CIRCUIT PACKAGES

CROSS REFERENCE TO A RELATED APPLICATION

This application claims the benefit of Provisional Patent Application Ser. No. 61/231,945, filed on Aug. 6, 2009, and entitled "Method of Forming Solderable Side-Surface Terminals of Quad No-lead Frame (QFN) Integrated Circuit Packages," which is incorporated herein by reference.

FIELD

This invention relates generally to integrated circuit (IC) packages, and in particular, to a method of forming solderable side-surface terminals of quad no-lead frame (QFN) IC packages or the like.

BACKGROUND

In the typical process of manufacturing quad no-lead frame (QFN) or thin QFN (TQFN) integrated circuit (IC) packages, an array of supported semiconductor dies are electrically connected to a common lead frame, and are commonly encapsulated by an injection molded compound. Then, the encapsulated structure undergoes a singulation process where the structure is diced up in order to form individual IC packages, each encapsulating a corresponding semiconductor die and other related elements. As discussed in more detail below, the singulation process results in an unprotected side of the package terminals to be exposed to the environment. As a consequence, oxides may form on the terminal sides, which may lead to poor solderability of the IC terminals during subsequent assembly of the IC package onto a printed circuit board (PCB). This is better explained with reference to the following example.

Figure 1A:
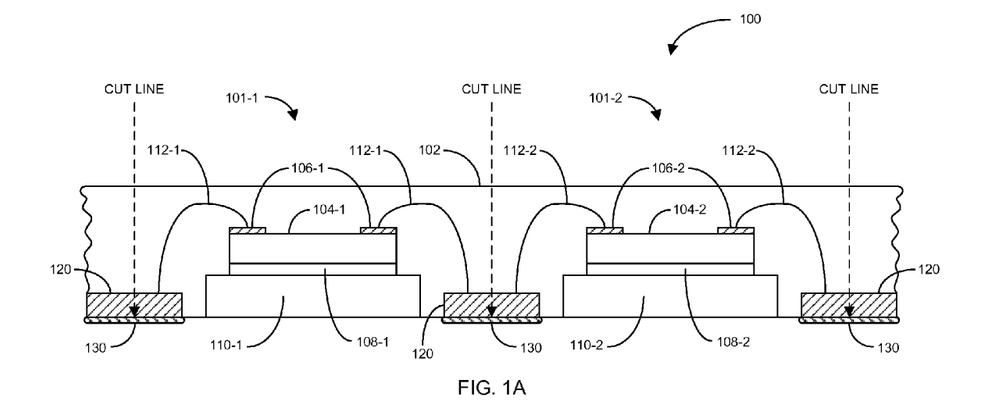
FIG. 1A illustrates a transparent front view of an array of exemplary QFN IC packages prior to a singulation manufacturing step.

FIG. 1A illustrates a transparent front view of an array 100 of exemplary QFN IC packages prior to the singulation manufacturing step. In this example, only two (2) adjacent QFN packages 101-1 and 101-2 are shown for ease of explanation. Each QFN package (101-1 or 101-2) may comprise a semiconductor die (104-1 or 104-2) securely disposed on a thermal pad (110-1 or 110-2) by way of an adhesive layer (108-1 or 108-2). Each semiconductor die (104-1 or 104-2) includes contact pads (106-1 or 106-2) electrically coupled to a copper (Cu) lead frame 120 by way of respective wirebonds (112-1 or 112-2). In the integrated array 100, the contact pads of adjacent semiconductor dies electrically connect, via the corresponding wirebonds, to the same terminal of the lead frame 120. Prior to singulation, a thin coating of solderable plating 130 (e.g., a Sn-based plating) is formed on the underside of each of the terminal of the lead frame 120 using, for example, an electroplating process. During singulation, the array 100 is diced up along a substantially vertical line at the midpoint between adjacent QFN packages, as illustrated by the dashed cut lines. The cutting of the array 100 may be performed using a stamping or sawing tool.

Figure 1B:
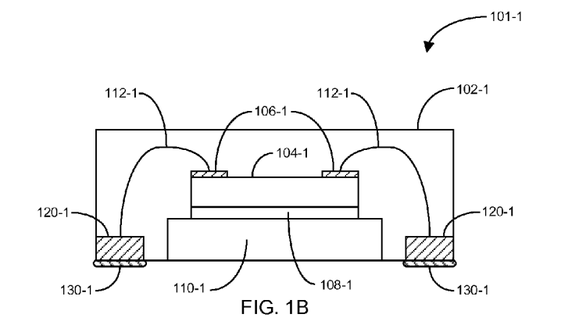
FIG. 1B illustrates a transparent front view of one of the exemplary QFN IC package after completion of the singulation manufacturing step.
Figure 1C:
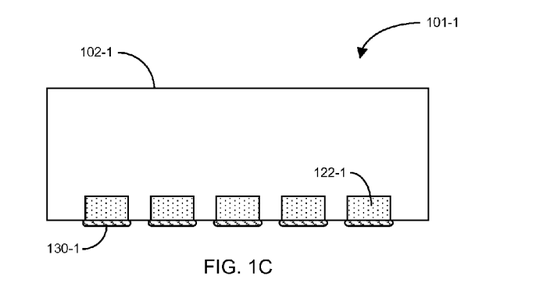
FIG. 1C illustrates a non-transparent side view of one of the exemplary QFN IC package after completion the singulation manufacturing step.

FIG. 1B illustrates a transparent front view of the exemplary QFN IC package 101-1 after completion of the singulation manufacturing step. As noted, the underside of the terminal 120-1 of the QFN IC package 101-1 is substantially covered by the solderable coating 130-1 disposed thereon. This protects the underside of the terminal 120-1 against oxidation due to aging and/or subsequent processing of the QFN IC package 101-1. However, the solderable coating 130-1 is not present on the sides of the terminals 120-1, where the cutting or separation of the individual QFN IC packages occurred. Accordingly, the sides of the terminals 120-1 are not protected from oxidation due to aging and subsequent processing. Thus, the sides of the terminals 120-1 are susceptible to oxidation and exposure to other contaminates. The side surfaces 122-1 of the terminals 120-1 are represented by a dotted shading in order to represent the oxidized and contaminated surfaces, as best shown in FIG. 1C. Such surfaces generally have poor solderability properties, which may make the assembly of the QFN package onto a PCB difficult and unreliable. The poor solderability properties may result in the formation of solder balls and other defects formed on the side terminals of the IC package.

SUMMARY

An aspect of the invention relates to a method of forming an integrated circuit (IC) package comprising (a) removing oxides from side surfaces of terminals of the IC package; (b) substantially covering an underside of the terminals of the IC package; and (c) forming a solder coating on the side surfaces of terminals of the IC packages while covering the underside of the terminals of the IC package. The solder coating on the side surfaces of the terminals protects the terminals from oxidation due to aging and subsequent processes. Additionally, the solder coating on the side surfaces of the terminals substantially improves the solderability of the IC package to printed circuit boards (PCBs) or other mountings. This further facilitates the inspection of the solder attachment using less expensive and complicated methods.

Other aspects, advantages and novel features of the present invention will become apparent from the following detailed description of the invention when considered in conjunction with the accompanying drawings.

DETAILED DESCRIPTION OF THE EXEMPLARY EMBODIMENTS

Figure 2:
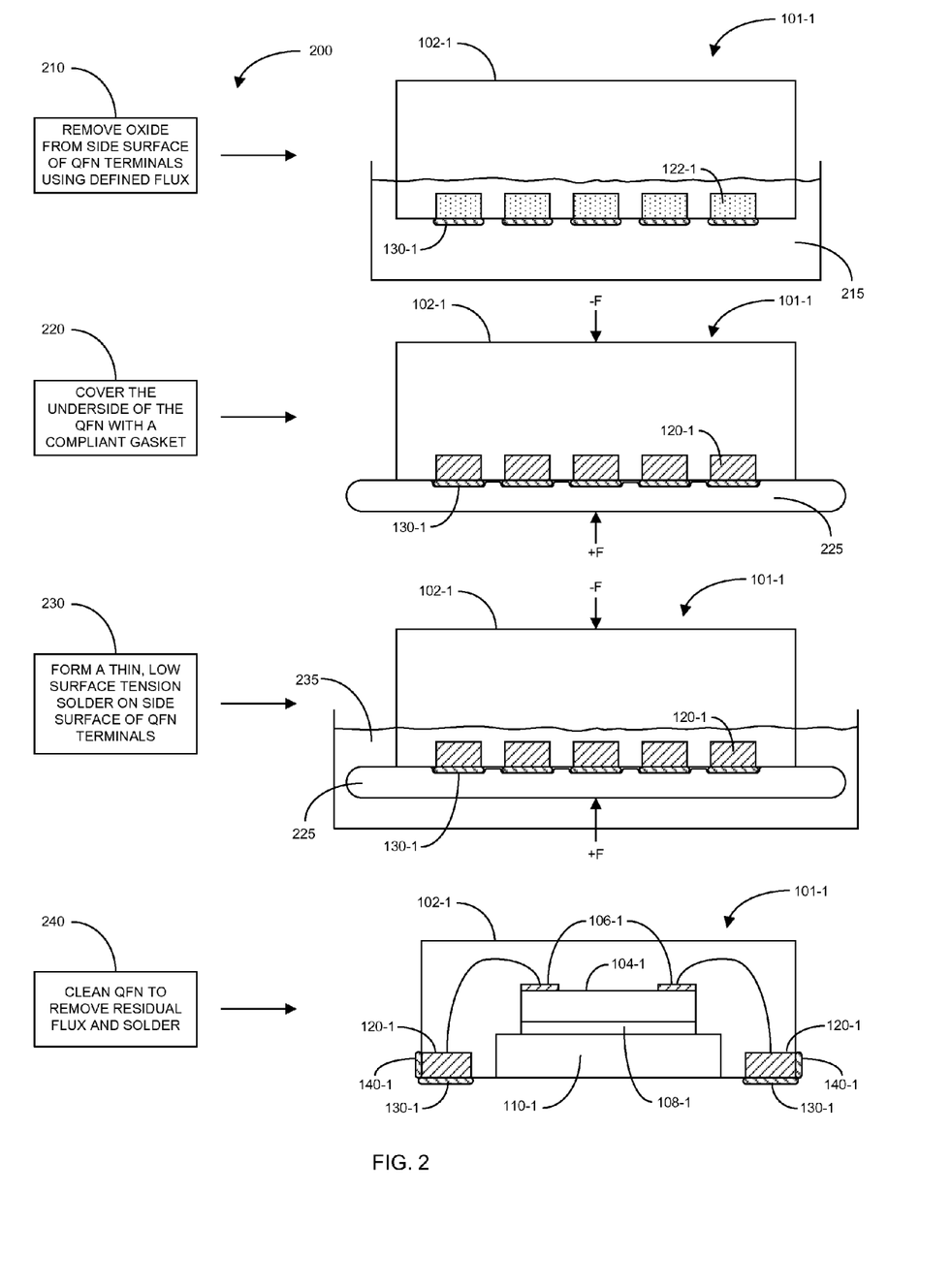
FIG. 2 illustrates a flow diagram of an exemplary method of forming an IC package and side views of the exemplary IC package at various stages of the method in accordance with an aspect of the invention.

FIG. 2 illustrates a flow diagram of an exemplary method 200 of forming an IC package and side views of the exemplary IC package 101-1 at various stages of the method in accordance with an aspect of the invention. Although a QFN or TQFN type IC package is used to illustrate the concepts of the methodology described herein, it shall be understood that the method 200 may be applied to other types of IC packages. The starting point of the method 200 is that the IC package 101-1 has already undergone the singulation process, and the underside of the terminals 120-1 has been coated with a thin layer of solderable material 130-1.

According to the method 200, the IC package 101-1, and specifically, the cut side surfaces 122-1 of its terminals 120-1, are subjected to a flux 215 (and/or other solution and/or treatment) to substantially remove the oxidation and/or other contaminates off the side surfaces 122-1 of the terminals 120-1 (Step 210). The purpose of step 210 is to prepare the copper-exposed surface 122-1 for a subsequent solder-coating operation.

Then, the underside of the IC package 101-1 is securely disposed on a cover or seal 225 (e.g., a compliant gasket, made out of a rubberized-elastic material, high-temperature silicon, or other material) (Step 220). The purpose of step 220 is to protect the solder coatings 130-1 on the underside of the terminals 120-1 from exposure to the subsequent side terminal solder-coating process and other related chemicals and environment conditions. A device, such as a clamp, may be employed to securely attach the IC package 101-1 to the cover 225, as represented by the negative force (−F) and positive force (+F) applied respectively to the top of the IC package and the bottom of the cover 225. The device should secure the IC package 101-1 to the cover 225 in a non-mechanically destructive manner so that it does not significantly scratch the top surface of the IC package. The securing device should also withstand the environment condition associated with the subsequent solder-coating step, which may be subjected to temperatures as high as 220 to 260° C. For example, the securing device may be made of a plastic material that can withstand such temperatures.

After the cover 225 has been secured to the underside of the IC package 101-1, the side surfaces of the terminals 120-1 are subjected to a solder bath 235 in order to form a thin, low surface tension, solder coating 140-1 (e.g., Sn-based solder) thereon (Step 230). The thin solder coating 140-1 protects the sides of the terminals 120-1 from oxidation and other adverse effects from exposure to the environment. In addition, the solder coating 140-1 provides an additional solderable surface of the terminals 120-1 of the IC package 101-1. This substantially improves the assembly of the IC package 101-1 onto a PCB. An acceptable criteria for the thin solder coating 140-1 may be that at least 50% of the side surface of the terminal 120-1 is covered by the solder coating.

The solder-coating process may involve first performing a slow preheating of the IC package 101-1 to a temperature substantially close to the temperature of the solder bath 235 in a nitrogen-purged environment, then subjecting the IC package 101-1 to the solder bath. This reduces thermal stress on the IC package 101-1. Additionally, after the solder coating 140-1 has been completed, the IC package 101-1 is allowed to slowly cool again in order to reduce thermal stress on the IC package 101-1.

After the solder-coating process is complete, the securing device and the cover 225 are removed from the IC package 101-1, and the IC package is subjected to a cleaning process (e.g., rinsing with DI water) in order to remove residual flux, solder and/or other contaminants from the IC package (Step 240). Additionally, the IC package 101-1 may undergo a laser marking step and a final electrical test before it is shipped out to end-users for final assembly onto products.

Figure 3:
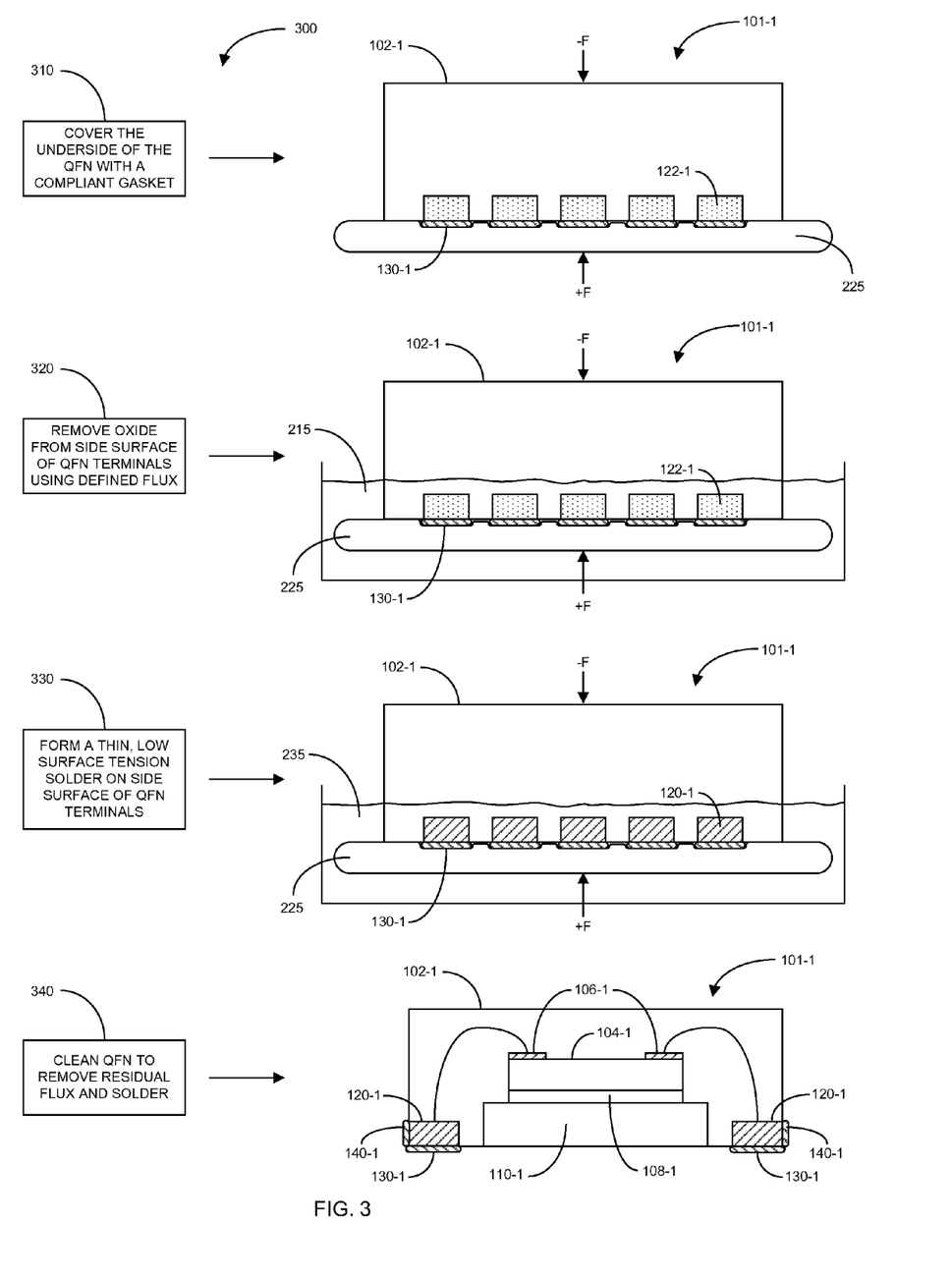
FIG. 3 illustrates a flow diagram of another exemplary method of forming an IC package and side views of the exemplary IC package at various stages of the method in accordance with another aspect of the invention.

FIG. 3 illustrates a block diagram of another exemplary method 300 of forming an IC package and side views of the exemplary IC package 101-1 at various stages of the method in accordance with another aspect of the invention. Again, although a QFN or TQFN type IC package is used to illustrate the concepts of the methodology described herein, it shall be understood that the method 300 may be applied to other types of IC packages. Similarly, the starting point of the method 300 is that the IC package 101-1 has already undergone the singulation process, and the underside of the terminals 120-1 has been coated with a thin layer of solderable material 130-1.

According to the method 300, the underside of the IC package 101-1 is securely disposed on a cover or seal 225 (e.g., a compliant gasket, made out of a rubberized-elastic material, high-temperature silicon, or other material) (Step 310). The purpose of step 310 is to protect the solder coatings 130-1 on the underside of the terminals 120-1 from exposure to subsequent processing, such flux-applying and solder-coating processes, and other related chemicals and environment conditions. A device, such as a clamp, may be employed to securely attach the IC package 101-1 to the cover 225, as represented by the negative force (−F) and positive force (+F) applied respectively to the top of the IC package and the bottom of the cover 225. The device should secure the IC package 101-1 to the cover 225 in a non-mechanically destructive manner so that it does not significantly scratch the top surface of the IC package. The securing device should also withstand the environment condition associated with the subsequent processes, which may be subjected to temperatures as high as 220 to 260° C. For example, the securing device may be made of a plastic material that can withstand such temperatures.

Then, according to the method 300, the IC package 101-1, and specifically, the side surfaces 122-1 of its terminals 120-1, are subjected to a flux 215 (and/or other solution and/or treatment) to substantially remove the oxidation and/or other contaminates off the side surfaces 122-1 of the terminals 120-1 (Step 320). The purpose of step 320 is to prepare the surface 122-1 for a subsequent solder-coating operation. In this case, the cover 225 protects the solder coating 130-1 and underside of the IC-package 101-1 from the flux-applying process.

After the oxides and contaminants are removed from the side surface 122-1 of the terminals 120-1, the side surfaces of the terminals 120-1 are subjected to a solder bath 235 in order to form a thin, low surface tension, solder coating 140-1 (e.g., Sn-based solder) thereon (Step 330). The thin solder coating 140-1 protects the sides of the terminals 120-1 from oxidation and other adverse effects from exposure to the environment. In addition, the solder coating 140-1 provides an additional solderable surface of the terminals 120-1 of the IC package 101-1. This substantially improves the assembly of the IC package 101-1 onto a PCB. An acceptable criteria for the thin solder coating 140-1 may be that at least 50% of the side surface of the terminal 120-1 is covered by the solder coating.

The solder-coating process may involve first performing a slow pre-heating of the IC package 101-1 to a temperature substantially close to the temperature of the solder bath 235 in a nitrogen-purged environment, then subjecting the IC package 101-1 to the solder bath. This reduces thermal stress on the IC package 101-1. Additionally, after the solder coating 130-1 has been completed, the IC package 101-1 is allowed to slowly cool again in order to reduce thermal stress on the IC package 101-1.

After the solder-coating process is complete, the securing device and the cover 225 are removed from the IC package 101-1, and the IC package is subjected to a cleaning process (e.g., rinsing with DI water) in order to remove residual flux, solder and/or other contaminants from the IC package (Step 340). Additionally, the IC package 101-1 may undergo a laser marking step and a final electrical test before it is shipped out to end-users for final assembly onto products.

Figure 4:
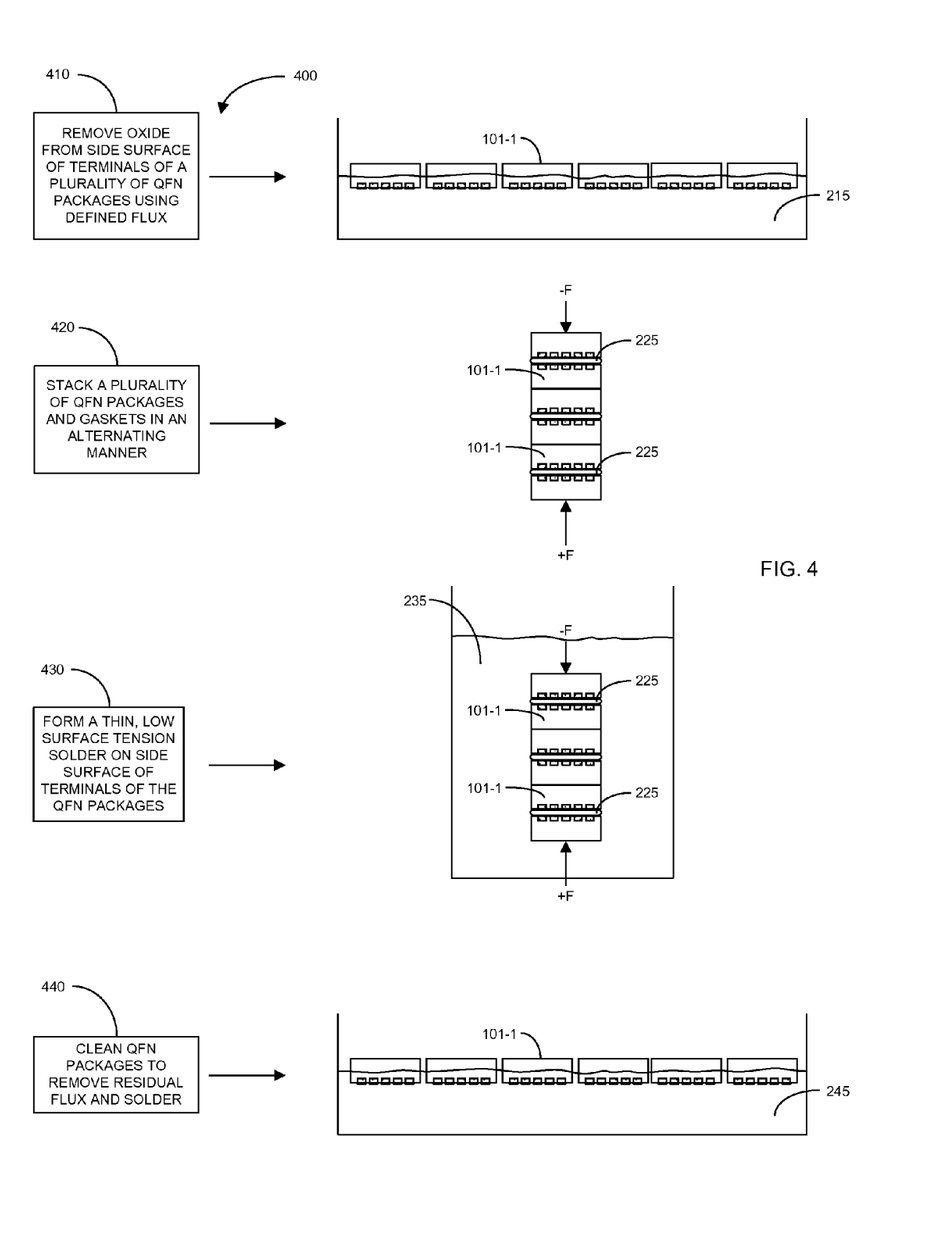
FIG. 4 illustrates a flow diagram of an exemplary method of processing a plurality of IC packages and side views of the IC packages at various stages of the method in accordance with another aspect of the invention.

FIG. 4 illustrates a flow diagram of an exemplary method 400 of processing a plurality of IC packages and side views of the IC packages at various stages of the method in accordance with another aspect of the invention. This method 400 is particularly suited for simultaneously processing a plurality (e.g., two or more) of IC packages. Although QFN or TQFN type IC packages are used to illustrate the concepts of the methodology described herein, it shall be understood that the method 400 may be applied to other types of IC packages. Similarly, the starting point of the method 400 is that the IC packages 101-1 have already undergone the singulation process, and their terminal undersides have been coated with a thin layer of solderable.

According to the method 400, a plurality of IC packages 101-1, and specifically, their terminal side surfaces, are subjected to a flux 215 (and/or other solution and/or treatment) to substantially remove the oxidation and/or other contaminates off the side surfaces of the terminals (Step 410). The purpose of step 410 is to prepare the copper-exposed terminal surfaces for a subsequent solder-coating operation.

Then, a stack of IC packages 101-1 and covers or seals 225 is formed (block 420). With this stack arrangement, the underside of each IC package 101-1 is securely disposed on a cover or seal 225 (e.g., a compliant gasket, made out of a rubberized-elastic material, high temperature silicone, etc.). The purpose of step 420 is to protect the solder coatings on the underside of the terminals from exposure to the subsequent side terminal solder-coating process and other related chemicals and environment conditions. A device, such as a clamp, as represented by the negative force (−F) and positive force (+F) applied respectively to the top and bottom IC packages of the stack, may be employed to securely maintain the stack arrangement. The device should securely maintain the stack arrangement in a non-mechanically destructive manner so that it does not significantly scratch the top and bottom IC packages. The securing device should also withstand the environment condition associated with the subsequent solder-coating step, which may be subjected to temperatures as high as 220 to 260° C. For example, the securing device may be made of a plastic material that can withstand such temperatures.

After the stack arrangement has been formed, the side surfaces of the terminals of the IC packages 101-1 are subjected to a solder bath 235 in order to form a thin, low surface tension, solder coating (e.g., Sn-based solder) thereon (Step 430). The thin solder coating protects the sides of the terminals from oxidation and other adverse effects from exposure to the environment. In addition, the solder coating provides an additional solderable surface of the terminals of the IC packages 101-1. This substantially improves the assembly of the IC packages 101-1 onto PCBs. An acceptable criteria for the thin solder coating may be that at least 50% of the side surface of each IC package terminal is covered by the solder coating.

The solder-coating process may involve first performing a slow pre-heating of the IC packages 101-1 to a temperature substantially close to the temperature of the solder bath 235 in a nitrogen-purged environment, then subjecting the IC packages 101-1 to the solder bath. This reduces thermal stress on the IC packages 101-1. Additionally, after the solder coating has been completed, the IC packages 101-1 may be allowed to slowly cool again in order to reduce thermal stress on the IC packages.

After the solder-coating process is complete, the stack arrangement is dismantled, and the IC packages 101-1 are subjected to a cleaning process (e.g., rinsing with DI water 245) in order to remove residual flux, solder and/or other contaminants from the IC package (Step 440). Additionally, the IC packages 101-1 may undergo a laser marking step and a final electrical test before they are shipped out to end-users for final assembly onto products.

Figure 5:
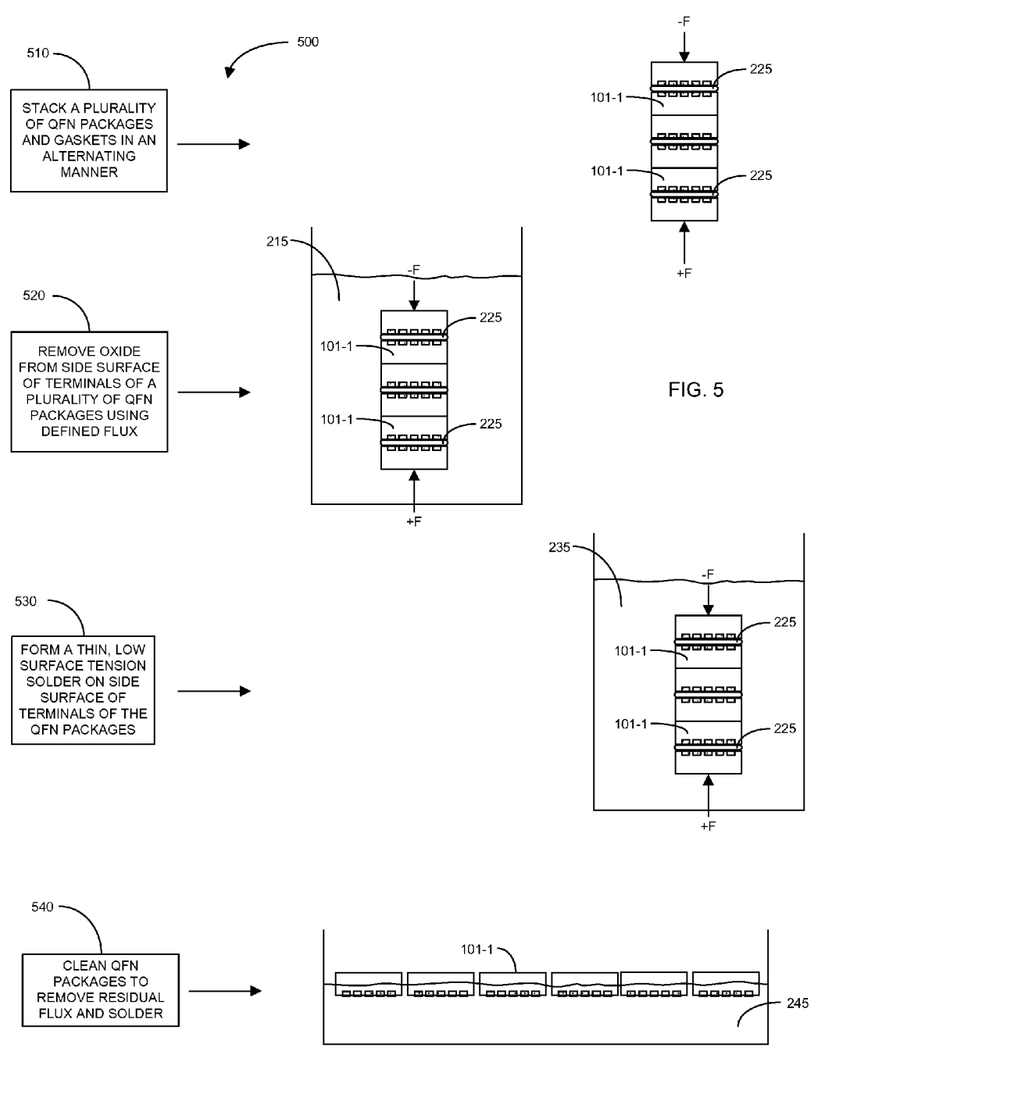
FIG. 5 illustrates a flow diagram of another exemplary method of processing a plurality of IC packages and side views of the IC packages at various stages of the method in accordance with another aspect of the invention.

FIG. 5 illustrates a flow diagram of another exemplary method of processing a plurality of IC packages and side views of the IC packages at various stages of the method in accordance with another aspect of the invention. This method 500 is also particularly suited for simultaneously processing a plurality (e.g., two or more) of IC packages. Although QFN or TQFN type IC packages are used to illustrate the concepts of the methodology described herein, it shall be understood that the method 500 may be applied to other types of IC packages. Similarly, the starting point of the method 500 is that the IC packages 101-1 have already undergone the singulation process, and their terminal undersides have been coated with a thin layer of solderable.

According to the method 500, a stack of IC packages 101-1 and covers or seals 225 is formed (block 510). With this stack arrangement, the underside of each IC package 101-1 is securely disposed on a cover or seal 225 (e.g., a compliant gasket, made out of a rubberized-elastic material, high temperature silicone, etc.). The purpose of step 510 is to protect the solder coatings on the underside of the terminals from exposure to the subsequent flux-applying and solder-coating processes and other related chemicals and environment conditions. A device, such as a clamp, as represented by the negative force (−F) and positive force (+F) applied respectively to the top and bottom IC packages, may be employed to securely maintain the stack arrangement. The device should securely maintain the stack arrangement in a non-mechanically destructive manner so that it does not significantly scratch the top and bottom IC packages. The securing device should also withstand the environment condition associated with the subsequent solder-coating step, which may be subjected to temperatures as high as 220 to 260° C. For example, the securing device may be made of a plastic material that can withstand such temperatures.

After the stack arrangement is formed, the plurality of IC packages 101-1, and specifically, their terminal side surfaces, are subjected to a flux 215 (and/or other solution and/or treatment) to substantially remove the oxidation and/or other contaminates off the side surfaces of the terminals (Step 520). The purpose of step 520 is to prepare the copper-exposed terminal surfaces for a subsequent solder-coating operation.

After Step 520, the side surfaces of the terminals of the IC packages 101-1 are subjected to a solder bath 235 in order to form a thin, low surface tension, solder coating (e.g., Sn-based solder) thereon (Step 530). The thin solder coating protects the sides of the terminals from oxidation and other adverse effects from exposure to the environment. In addition, the solder coating provides an additional solderable surface of the terminals of the IC packages 101-1. This substantially improves the assembly of the IC packages 101-1 onto PCBs. An acceptable criteria for the thin solder coating may be that at least 50% of the side surface of each IC package terminal is covered by the solder coating.

The solder-coating process may involve first performing a slow pre-heating of the IC packages 101-1 to a temperature substantially close to the temperature of the solder bath 235 in a nitrogen-purged environment, then subjecting the IC packages 101-1 to the solder bath. This reduces thermal stress on the IC packages 101-1. Additionally, after the solder coating has been completed, the IC packages 101-1 may be allowed to slowly cool again in order to reduce thermal stress on the IC packages.

After the solder-coating process is complete, the stack arrangement is dismantled, and the IC packages 101-1 are subjected to a cleaning process (e.g., rinsing with DI water 245) in order to remove residual flux, solder and/or other contaminants from the IC package (Step 540). Additionally, the IC packages 101-1 may undergo a laser marking step and a final electrical test before they are shipped out to end-users for final assembly onto products.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A method of forming an integrated circuit (IC) package, comprising:
    removing oxides from a cut side surface of a terminal of a singulated IC package, wherein the underside of the terminal comprises a solderable coating;
    placing the underside of the IC package on a cover or seal, the cover or seal substantially covering an underside of the terminal of the IC package and substantially exposing the cut side surface of the terminal; and
    forming a solder coating on the cut side surface of the terminal of the IC package while covering the underside of the terminal of the IC package;
    pre-heating the IC package to a temperature substantially the same as but less than a temperature of a solder bath; and
    subjecting the cut side surface of the terminal of the IC package to the solder bath to form the solder coating while protecting the solderable coating on the underside of the terminal by the cover or seal from the subsequent solder coating on the cut side surface of the terminal of the IC package.

2. The method of claim 1, wherein the covering or seal comprises a gasket.

3. The method of claim 2, wherein the gasket comprises a compliant or elastic material.

4. The method of claim 2, wherein the gasket comprises a rubber or silicone material.

5. The method of claim 1, wherein placing the underside of the IC package on the cover or seal comprises securely attaching an underside of the IC package to the cover or seal.

6. The method of claim 5, wherein securely attaching the underside of the IC package to the cover or seal comprises biasing the IC package against the cover using a mechanical device.

7. The method of claim 6, wherein the mechanical device comprises a clamp.

8. The method of claim 1, wherein removing oxides from the side surface of the terminal of the IC package comprises exposing the side surface of the terminal to a flux.

9. The method of claim 1, wherein the oxides are removed from the cut side surface of the terminal of the singulated IC package before placing the underside of the IC package on the cover or seal.

10. The method of claim 1, wherein removing oxides from the cut side surface of the terminal is performed while the underside of the terminal is substantially covered.

11. The method of claim 1, wherein forming the solder coating on the side surface of the terminal of the IC package further comprises allowing the IC package to cool from the substantially temperature of the solder bath.

12. The method of claim 1, further comprising cleaning the IC package to remove flux residue therefrom.

13. The method of claim 1, further comprising cleaning the IC package to remove solder residue therefrom.

14. The method of claim 1, further comprising laser marking the IC package.

15. The method of claim 1, further comprising performing electrical test on the IC package.

16. The method of claim 1, wherein the IC package comprises a quad no-lead frame (QFN) IC package.

17. The method of claim 1, wherein the IC package comprises a thin quad no-lead frame (TQFN) IC package.

18. The method of claim 1, further comprising performing a singulation process to form the IC package prior to removing oxides from the cut side surface of the terminal of the singulated IC package.

* * * * *